United States Patent [19]

Le Roux et al.

[11] Patent Number: 4,734,595
[45] Date of Patent: Mar. 29, 1988

[54] DEVICE FOR CONTROLLING AN OUTPUT CIRCUIT OF AN INTEGRATED CIRCUIT

[75] Inventors: Géard Le Roux, La Tranche; Marius Reffray, Grenoble, both of France

[73] Assignee: Thomson-CSF, Paris, France

[21] Appl. No.: 908,673

[22] Filed: Sep. 17, 1986

[30] Foreign Application Priority Data

Sep. 17, 1985 [FR] France ................. 85 13759

[51] Int. Cl.⁴ .................. H03K 3/26; H03K 17/60
[52] U.S. Cl. .................... 307/315; 307/255; 307/296 R; 307/303
[58] Field of Search .......... 307/315, 296 R, 254, 307/303, 255; 357/46

[56] References Cited

U.S. PATENT DOCUMENTS

| | | | |
|---|---|---|---|
| 4,013,940 | 3/1977 | Kaji | 323/351 |
| 4,109,167 | 8/1978 | Kaji et al. | 307/315 |
| 4,318,164 | 3/1982 | Onodera | 363/21 |
| 4,607,171 | 8/1986 | Hellegaard | 307/315 |
| 4,633,100 | 12/1986 | Van Tuijl | 307/315 |

OTHER PUBLICATIONS

Patent Abstracts of Japan, vol. 1, No. 30, Mar. 29, 1987, 7 pages, 1065 E 76; & JP-A-51 122 360 (Sony K.K.), 10-26-1976.

Primary Examiner—Stanley D. Miller
Assistant Examiner—B. P. Davis
Attorney, Agent, or Firm—Oblon, Fisher, Spivak, McClelland & Maier

[57] ABSTRACT

The present invention relates to a method for controlling a Darlington type circuit comprising a main transistor and an auxiliary transistor forming part of an integrated circuit, this control method allowing to reduce consumption, and with this purpose, the control transistor of the Darlington type circuit is connected, not as in classical schemas to the power supply voltage $V_{CC}$ but to an auxiliary voltage $V_{AUX}$ which, in the case if the drawing is higher than $V_{CC}$ be a quantity of about $V_{BE1}+V_{BE2}-V_{CE1}$, $V_{BE1}$ and $V_{BE2}$ being the base-emitter voltages of the main transistor and of the auxiliary transistor and $V_{CE1}$ being the collector-emitter voltage of the main transistor and preferably this auxiliary voltage is obtained from the power supply $V_{CC}$ by a continuous-continuous converter forming part of the same integrated circuit as the Darlington type circuit.

6 Claims, 11 Drawing Figures

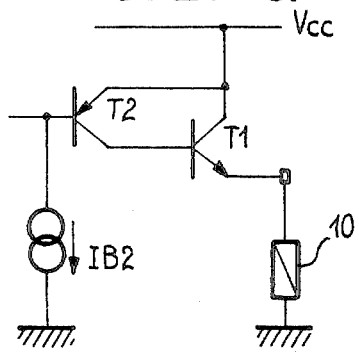
FIG_1-a
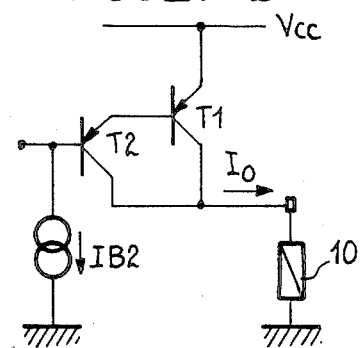
FIG_1-b
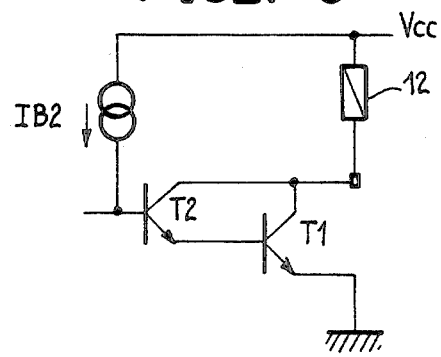
FIG_1-c
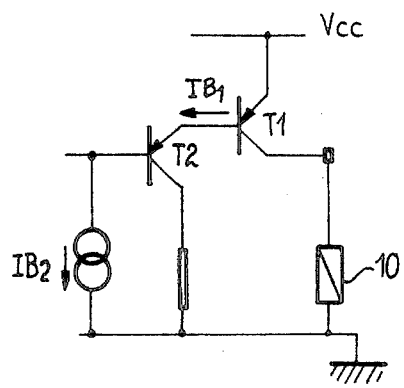
FIG_2-a
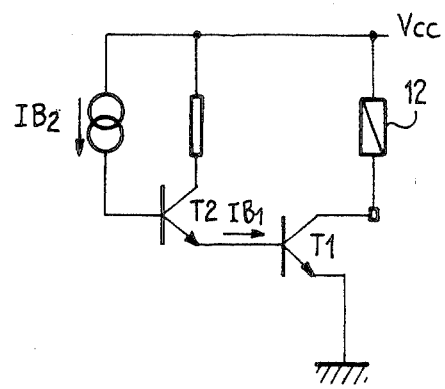
FIG_2-b

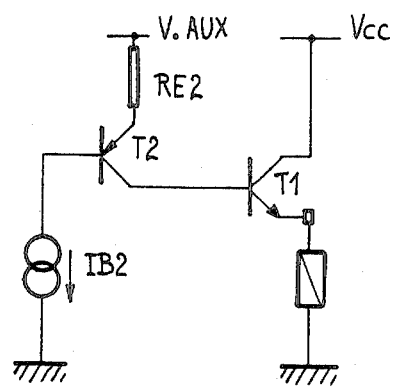
FIG_3-a
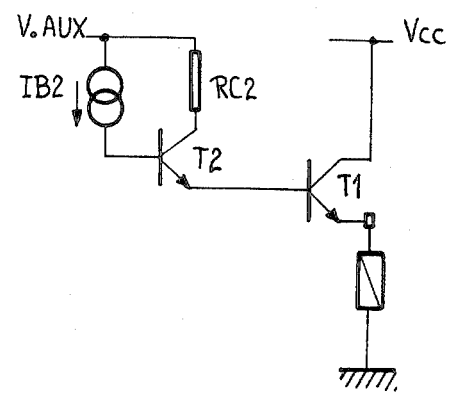
FIG_3-b
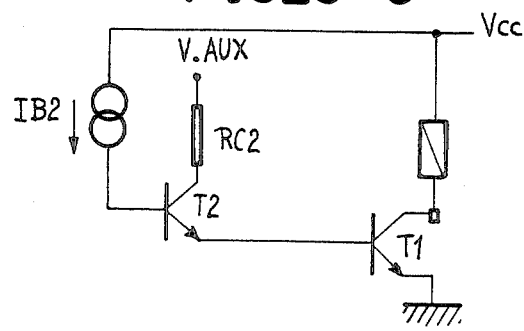
FIG_3-c
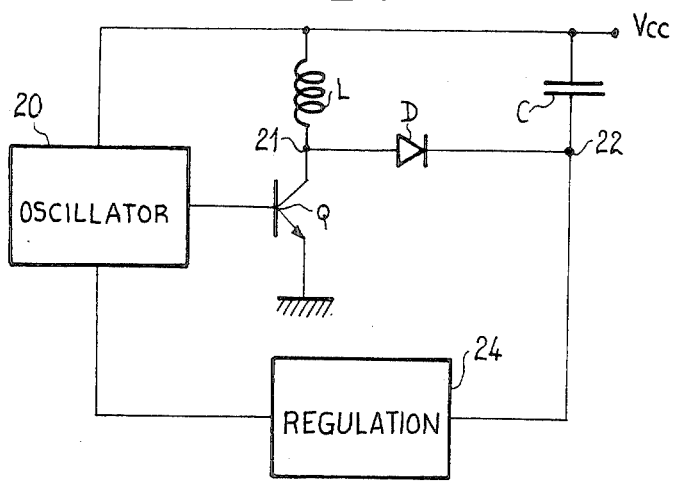
FIG_4

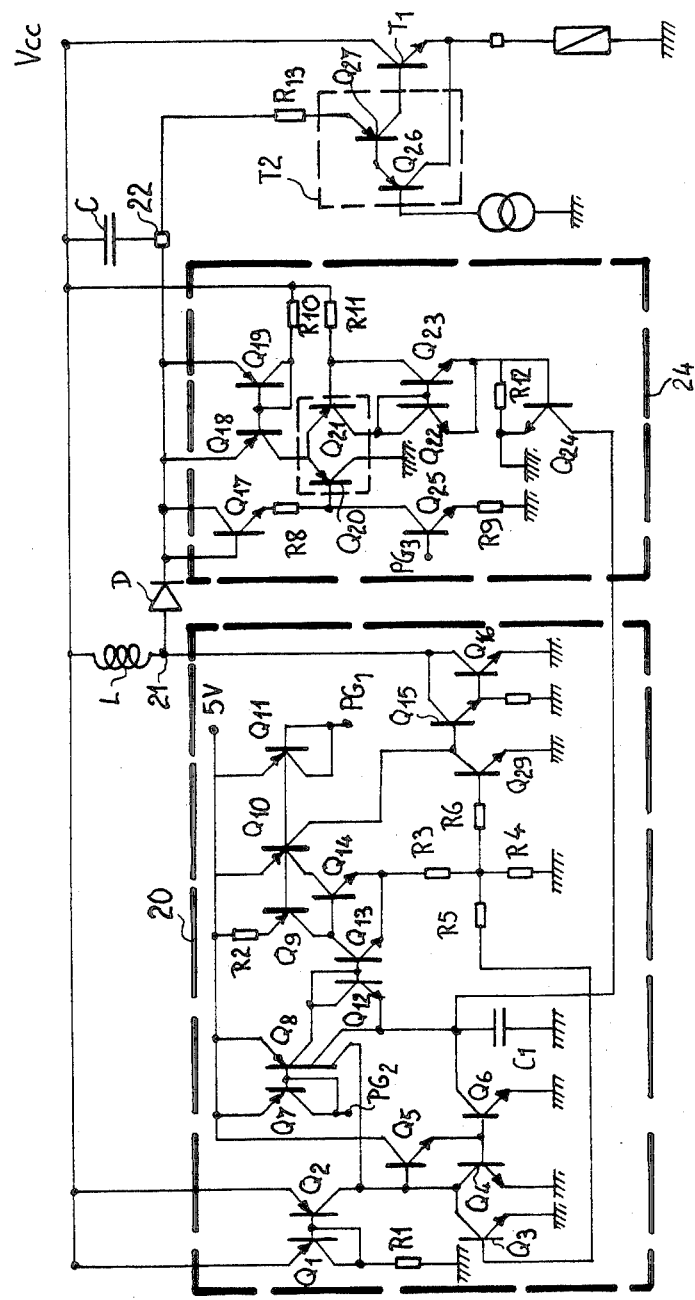
FIG_5

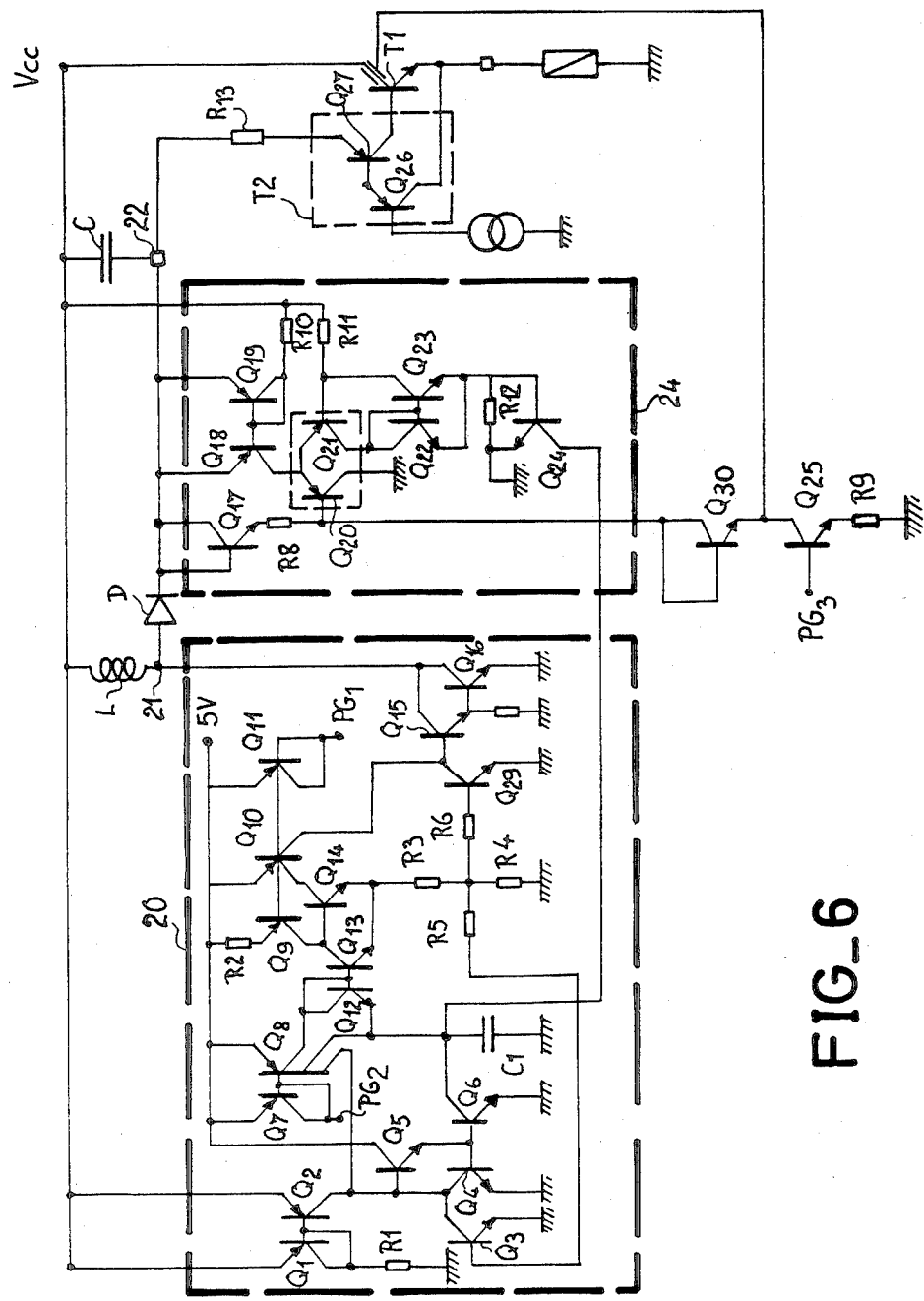
FIG_6

DEVICE FOR CONTROLLING AN OUTPUT CIRCUIT OF AN INTEGRATED CIRCUIT

BACKGROUND OF THE INVENTION

Field of the Invention

In the field of integrated circuits, output circuits exist which frequently consume a certain amount of power, such as for example, Darlington type circuits. The present invention relates to a control circuit allowing to reduce this power consumption.

Darlington type circuits are represented in FIG. 1 in several of their possible configurations. One general characteristic of Darlington type circuits is that they comprise at least two bipolar transistors and that the gain of the circuit assembly is the product of the gains of each of the transistors.

In FIG. 1A, the Darlington type circuit is constituted by a main transistor T1 of the NPN type and a control transistor T2 of the PNP type. The collector of the transistor T1 is connected to the power supply and its emitter to the earth through the intermediary of a load 10. The base of the transistor T1 is connected to the collector of the transistor T2 of which the emitter is connected to the power supply $V_{CC}$. The control signal is applied to the base of the transistor T2 and is symbolized by a current supply source $I_{B2}$ connected between this base and the earth.

In FIG. 1B, the Darlington type circuit comprises two PNP type bipolar transistors T1 and T2. The emitter of the main transistor T1 is connected to the power supply $V_{CC}$ and the collector of the transistor T1 is connected to the earth through the intermediary of a load 10. The base of the transistor T1 is connected to the emitter of the control transistor T2 of which the collector is connected to the collector of the transistor T1. The base of the transistor T2 receives the control signal schematized in the form of a current supply $I_{B2}$ connected between this base and the earth.

FIG. 1C again represents a Darlington assembly in which the two transistors are of the NPN type. The collector of the transistor T1 is connected to the collector of the transistor T2, these two collectors being connected to the power supply $V_{CC}$ through the intermediary of a load 12. The emitter of the transistor T1 is connected to the earth and its base is connected to the emitter of the transistor T2. The base of the transistor T2 receives the control signal symbolized by a current supply $I_{B2}$ connected between the power supply $V_{CC}$ and this base.

Thus, a Darlington type circuit can be defined in a general manner as a bipolar circuit comprising a first main transistor T1 of which a first main electrode is connected to a power supply terminal $V_{CC}$ and a second main electrode is connected to an earth terminal, a load 10, 12 being connected between one of these main electrodes and the corresponding terminal, the base of this first transistor being connected to a second main electrode of a second transistor, called auxiliary or control transistor, a main electrode of the second transistor being connected to a main electrode of the first transistor and the base of the second transistor receiving a control signal.

In order for a Darlington type circuit to operate satisfactorily, whether the load is connected to the earth or to the power voltage and whether the output transistor is of the PNP or NPN type, it is necessary to supply a strong base current to the main transistor in order to obtain suitable saturation. This means that, despite the gain of the auxiliary transistor T2, this auxiliary transistor must receive a high base current on the scale of currents generally present in an integrated circuit.

The power $P_d$ dissipated throughout this Darlington assembly can be expressed by the following formula:

$$P_d \text{ (dissipated power)} = (V_{CE2} + V_{BE1}) I_O + I_{B2} \times V_{CC} \tag{1}$$

$V_{CE2}$ is the collector-emitter saturation voltage of the transistor T2,
$V_{BE1}$ is the base-emitter voltage of the transistor T1,
$I_O$ is the current in the charge,
$V_{CC}$ is the power supply voltage of the circuit,
$I_{B2}$ is the base current of the transistor T2.

As will be seen herein-below, the term $I_{B2} \times V_{CC}$ is normally insignicant.

In order to reduce the dissipated power, configurations of the type such as represented in FIG. 2 have sometimes been adopted, that are known as "pseudo-Darlington type" circuits. These circuits are characterized by the fact that the main electrode of the control transistor T2 not connected to the base of the transistor T1, instead of being connected to a main electrode of this transistor T1 is connected to the earth or to the power voltage according to the type of bipolar transistor, through the intermediary of a resistance.

More particularly, in FIG. 2A, the two bipolar transistors of the pseudo-Darlington assembly are of the PNP type. The emitter of the transistor T1 is connected to the power supply $V_{CC}$ and its collector to the earth through the intermediary of a load 10. The base of the transistor T1 is connected to the emitter of the transistor T2 of which the collector is connected to the earth through the intermediary of a resistance. In FIG. 2B, the two transistors are of the NPN type. The collector of the transistor T1 is connected to the power supply $V_{CC}$ through the intermediary of a charge 12 and its emitter to the earth. The base of the transistor T1 is connected to the emitter of the transistor T2 of which the collector is connected to the power supply source through the intermediary of a resistance.

It can be seen that in this type of assembly the dissipated power will be substantially:

$$P_d = V_{CE1} \times I_O + V_{CC} \times I_{B1} + V_{CC} \times I_{B2} \tag{2}$$

where $I_{B1}$ is the current base of the transistor T1, the other notations being the same as those previously indicated herein-above (the term $V_{CC} \times I_{B2}$ is insignificant).

A numerical application allows to render more apparent the problem involved. In the case of FIGS. 1 or 2, $I_O = 2$ amperes is common (it is the high current that is sought to pass into the load), $V_{CC} = 30$ volts, $V_{BE1}$ (for $I_O = 2$ amperes) of about 1.2 V, $V_{CE2}$ (for a collector current of 50 mA) of about 0.3 V and $V_{CE1} = 0.8$ V for $I_O = 2$ amperes.

In the case of FIG. 1, with $I_{B2} = 1$ mA:

$$P_d = (0.3 + 1.2) \, 2 + 30 \times 10^{-3} = 3.03 \ W$$

In the case of FIG. 2, with $I_{B1} = 50$ mA:

$$P_d = 0.8 \times 2 + 30 \times 50 \times 10^{-3} + 30 \times 10^{-3} = 3.13 \ W$$

One object of the present invention is to provide control means for a Darlington type or pseudo-Darlington type circuit which allows, with a high power voltage (for example 30 V) to reduce the dissipated power.

In order to achieve this object as well as certain others, the present invention provides a device for controlling an output Darlington type circuit of an integrated circuit comprising two transistors, in which the first transistor has a first main electrode connected to a power supply terminal and a second main electrode connected to an earth terminal, a load being connected between one of these main electrodes and the corresponding terminal, the base of this first transistor being connected to a second main electrode of the second transistor of which the base receives a control current. In this control device, the first main electrode of the second transistor is connected to an auxiliary power supply ($V_{AUX}$) so that $(V_{AUX})$ is substantially equal to $V + V_{BE1} + V_{CE2}$.

where:

$V_{BE1}$ is the base-emitter voltage of the first transistor;
$V_{CE2}$ is the collector-emitter voltage of the second transistor at saturation and;
V is the potential of the earth if the load is connected to the power supply terminal and is equal to $V_{CC} - V_{CE1}$ if the load is connected to the earth, $V_{CE1}$ being the collector-emitter voltage at saturation of the first transistor.

The auxiliary voltage $V_{AUX}$ is, according to one aspect of the present invention, obtained from the power supply source $V_{CC}$ through a continuous-continuous converter included in the integrated circuit comprising the Darlington type circuit.

The converter is preferably an inductance converter with accumulation capacity and discontinuous conduction of the "flyback" type comprising an inductance of which the charge duration is controled by an oscillating device and which is thereafter discharged into a capacitor.

BRIEF DESCRIPTION OF THE DRAWINGS

These objects, features and advantages of the present invention will be explained in further detail in the following description of particular embodiments given with reference to the appended figures in which:

FIGS. 1A, 1B and 1C described herein-above represent wiring diagrams of Darlington type circuits according to the prior art;

FIGS. 2A and 2B described herein-above represent wiring diagrams of pseudo-Darlington type circuits according to the prior art;

FIGS. 3A, 3B and 3C illustrate a control mode of Darlington type circuits according to the present invention;

FIG. 4 schematically represents, and partially in the form of blocks, a continuous-continuous converter circuit according to the present invention;

FIG. 5 schematically represents a first detailed embodiment of the present invention; and FIG. 6 represents an improved embodiment of the present invention.

DETAILED DESCRIPTION OF THE DRAWINGS

As will be seen herein-below, the basic idea of the present invention consists in supplying the auxiliary transistor or control transistor T2 of a Darlington type circuit by an auxiliary voltage $V_{AUX}$ distinct from the power supply $V_{CC}$ of the main transistor T1 which is located at the terminals of the main electrodes of this transistor T1 and of the charge.

In FIG. 3A, the Darlington type circuit comprises a NPN type main transistor of which the collector is connected to the power supply $V_{CC}$ and the emitter to the earth through the intermediary of a load through which flows a current $I_O$. The base of the transistor T1 is connected to the collector of a PNP type auxiliary transistor T2. The emitter of this transistor T2 is connected to an auxiliary power supply $V_{AUX}$ through the intermediary of a resistance of emitter RE2. The control signal for the circuit is constituted by a current supply $I_{B2}$ connected between the base of the transistor T2 and the earth.

In FIG. 3B, the two transistors are of the NPN type. As in the case of FIG. 3A, the collector of the transistor T1 is connected to the power supply $V_{CC}$ and its emitter to the earth through the intermediary of the charge to be supplied. The base of the transistor T1 is connected to the emitter of the transistor T2 of which the collector is connected to an auxiliary power voltage $V_{AUX}$ higher than $V_{CC}$ through the intermediary of a resistance RE2. The base of the transistor T2 receives the control signal symbolized by a current supply $I_{B2}$ connected between this base and the auxiliary supply $V_{AUX}$.

In the case of FIG. 3C, the two transistors are also of the NPN type. The difference with the diagram of FIG. 3B is that the load is connected to the $V_{CC}$ terminal, and the transistor T2 is controlled by a current $I_{B2}$ connected to the power supply $V_{CC}$. In this case, the auxiliary voltage $V_{AUX}$ is lower than the power voltage $V_{CC}$, and is determined with respect to the earth.

Therefore, one of the basic ideas of the invention is to provide an auxiliary voltage so as to obtain a voltage higher than the power supply voltage in the case of a load connected to the earth and higher than the earth in the case of a load connected to the power supply. The value of this auxiliary voltage must be determined with care. On the one hand, it must be sufficient to supply the switching device, on the other hand, it must be as low as possible in order not to provoke high dissipated power. Therefore, the auxiliary voltage must be higher than the power voltage reduced by $V_{CE1}$ or than the earth according to the case, of a quantity of about $V_{BE1} + V_{CE2}$ $V_{BE1}$ being the base-emitter voltage of the transistor T1 and of the transistor T2 and $V_{CE2}$ the collector-emitter voltage of the transistor T2.

In the case of the assembly of one of FIGS. 3A, B or C, the dissipated power $P_d$ is expressed as:

$$P_d = V_{CE1} \times I_O + (V_{AUX} - V_{CC})I_{B1} + V_{AUX} \times I_{B2} \quad (3)$$

By repeating the numerical examples cited hereinabove, and by selecting $V_{AUX} - V_{CC} = 1 V$, the following dissipated power values are obtained:

$P_d = 0.8 \times 2 + 1 \times 50 \ 10^{-3} + 31 \ 10^{-3}$ $P_d = 1.6 + 0.05 + 0.03 = 1.7 \ W$ It can be seen that the predominant factor is the first: $V_{CE1} \times I_O$. This factor is the only predominant factor whereas, in the case of FIG. 2, the additional factor $V_{CC} \times I_{B1}$ was far from being insignificant and, in the case of FIG. 1, the total $V_{CE2}+V_{BE1}$ was distinctly higher than $V_{CE1}$. Therefore, with respect to the cases of FIGS. 1 and 2, with the same voltage $V_{CC}$ selected at a value of about 30 V, the gain in dissipated power is about 45%.

However, if it is desired to effectively minimize the dissipated power, it is necessary to maintain at an optimal value as low as possible the difference $V_{AUX}-V_{CC}$ that constitutes the second term of the equation (3).

With this purpose, according to another aspect of the present invention, it is foreseen to supply this auxiliary voltage from the power supply voltage $V_{CC}$ by a continuous-continuous converter. In addition to this advantage of optimization of the difference $V_{AUX}, -VCC$ a supplementary advantage to providing a continuous-continuous converter is that said device can advantageously be integrated in the integrated circuit chip comprising the Darlington type circuit of which it is desired to reduce the consumption. Furthermore, a continuous-continuous converter has a high yield of about 80%, especially when it is adapted for a precise function, and it practically does not increase the power dissipated by the power circuit. The formula (3) herein-above is only affected by the fact that the second term is multiplied by a factor I/R, R being the yield of the converter which is about 80%. Therefore, the second term passes from a value of $50.10^{-3}$ to about $60.10^{-3}$ and remains insignificant.

A continuous-continuous converter having a particularly high yield and suitable for an integration is schematically represented, partially under the form of units or blocks, in FIG. 4. It comprises an oscillating device 20, connected to the power supply $V_{CC}$, which controls the base of a commutation transistor Q. In the example represented, the transistor Q is of the NPN type and has its emitter connected to the earth and its collector connected to the power supply through the intermediary of an inductance L. The connecting point 21 between the collector and the inductance is connected through the intermediary of a diode D to an output terminal 22 on which is available the auxiliary voltage $V_{AUX}$, a capacitor C being connected between this terminal and the power supply terminal $V_{CC}$. An adjusting circuit 24 is connected between the terminal 22 and the oscillating device 20 in order to adjust the auxiliary voltage. This inductance converter is a discontinuous conduction elevator accumulation converter often known as a "flyback converter". The oscillating device has a period T and, in a first state, renders the transistor Q conductive for a duration t during which time the inductance L is charged. When the oscillating device changes state, the transistor Q is blocked and the inductance L is discharged into the capacity C through the intermediary of the diode D for a duration $t_1$, the period T being such that $t+t_1$ is shorter than T. The duration $t_1$ does not depend upon the oscillating device but corresponds to the duration of energy transfer from the inductance L to the capacitor C. It thus depends upon the values of L and C and upon the parasitic resistances of the circuit as well as the threshold value of the diode, independently from the value of $V_{CC}$.

At the terminals of the capacitor C is thus obtained an auxiliary voltage higher than the power voltage. In this case, $V_{AUX}-V_{CC}=V_{CC}\times t/t_1$. In order that $V_{AUX}$ differs from $V_{CC}$ by at least 1 V as explained herein-above, if $V_{CC}=30$ V, $t/t_1$ will be then selected substantially equal to 1/30.

From observations as to the current to be supplied by this auxiliary supply and from the laws of Lenz, will be drawn other equations which will allow the calculation of the oscillating device:

$I_L \max = 2I_O \times T/t_1$, and $I_L \max = V_{CC} \times t/L$ in which $I_L$ is the current in the inductance.

These equations show that the oscillating device must be of a period T comprising a phase duration proportional to the value of $V_{CC}$ and a residual phase duration longer than $t_1$.

FIG. 5 represents a detailed embodiment of the invention in the case where a continuous-continuous converter of the type shown in FIG. 4 is used and it is applied to a Darlington type circuit, such as that represented in FIG. 3A, in which the transistor T1 is a NPN transistor and transistor T2 is a PNP transistor.

More particularly, in FIG. 5, the unit 20 constituting the oscillating device and the unit 24 constituting the adjustment circuit have been shown in detail.

The oscillating unit 20 comprises transistors Q1 to Q16 and a transistor Q29, resistances R1 to R6 and a small-capacity capacitor, typically having a capacity of 30–60 picofarads.

The PNP type transistors Q1 and Q2 are mounted in current mirror, the current being controlled by the resistance R1 connected to the collector of the transistor Q1. Furthermore, the PNP type transistors Q7 and Q8 are also mounted in current mirror, their emitters being connected to a voltage of 5 V and the collector of transistor Q7 to an internal current supply PG1 of the circuit. The transistors Q9, Q10, and Q11 of the PNP type are also mounted in current mirror, their emitters being connected to a 5 V voltage and their bases, as well as the collector of the transistor Q11, to an internal current supply PG1 of the circuit. These transistors are thus in a permanently conducting state.

A detailed description of all the connections of these various transistors will not be given, since said connections are apparent from the drawings. Only the main connections with respect to the operating of the circuit will be described.

The rhythm of the oscillating device 20 is determined by the charge cycle of the capacitor C1. Initially, this capacitor is charged under the effect of a constant current issuing from the first two collectors of the three-collector PNP transistor Q8, the first collector being directly connected to the capacitor C1 and the second collector being connected to this capacitor through the intermediary of the NPN type transistor Q12 mounted in diode. During this time, the NPN type transistor Q13 is blocked and the NPN type transistor Q14 saturated. The current issuing from the transistor Q14 flows towards the earth through the resistances R3 and R4 and develops on R4 enough voltage to saturate the NPN transistor Q3 switchingly mounted with the NPN transistor Q4 which, in turn, is blocked. The current issuing from the transistor Q2 will thus flow towards the earth through the intermediary of the transistor Q3. While the capacitor C1 is charged, the voltage at its terminals increases until the potential on the base of the transistor Q12, i.e. also on the base of the transistor Q13 reached a value higher than the voltage at the terminals of the resistances R3 and R4 by a quantity equal to the base-emitter actuating voltage VBE. The transistor Q13 thus becomes conductive while the transistor Q12 and the transistor Q14 are blocked. The current in the assembly R3, R4 which passes through the resistance R2, the transistor Q9 and the transistor Q13 becomes insufficient for the voltage at the terminals of resistance R4 to allow the conduction of the transistor Q3. This transistor is blocked, while the transistor Q4 becomes conducting. The current in the transistor Q2 proportional to $V_{CC}$, to which is added half of the current in the transistor Q8, due to the connection between the collector of the transistor Q2 and the third collector of the transistor Q8 the surface of which is substantially half the surface of the assembly of the three collectors of this transistor, flows into the transistor Q4. The transistor Q6, of which the base is connected to that of the transistor Q4, is rendered conducting and thus discharges the capacitor C1 with a current proportional to the power supply voltage $V_{CC}$. This discharge is continued until the potential on the base of the transistor Q13 becomes lower than the voltage drop in the resistances R3 and R4 increased by the base-emitter voltage of the transistor Q13. The transistor Q14 thus again conducts and the cycle is repeated.

A cycle of a total duration T has been achieved for the oscillating device, the duration in a second state (charge of the capacitor C1) being a duration t proportional to the value of $V_{CC}$; and the duration in the first state being a constant duration $t_1$ whatever the value of $V_{CC}$.

The unit 24 constituting the control circuit comprises bipolar transistors Q17 to Q25 and resistances R8 to R11.

In this unit are located permanently conducting transistors Q17, Q18, Q19 and Q25. The NPN transistor Q17 is mounted in diode, in series with the resistance R8, the transistor Q25, also of the NPN type, and the resistance R9. The base of the transistor Q25 receives a current supply PG3 of internal biasing. The transistors Q18 and Q19 are mounted in current mirror, their emitters being connected to the auxiliary voltage (terminal 22) and their bases being interconnected and also connected to the collector of the transistor Q19 and from there, through the intermediary of the resistance R10, to the power supply $V_{CC}$. The collector of the transistor Q18 supplies current to a comparator constituted by two NPN transistors Q20 and Q21. The base of the transistor Q20 or the first input of the comparator is connected to the connecting point of the resistance R8 and of the collector of the transistor Q25; and the base of the transistor Q21 or the second input of the comparator is connected to the power supply $V_{CC}$ through the intermediary of the resistance R11. Therefore, the comparator compares the auxiliary voltage $V._{AUX}$ reduced by the supply drop in the diode Q17 and in the resistance R8 with the power supply $V_{CC}$. Once the supply $V_{CC}$ becomes lower than the other term of comparison, the transistor Q21 becomes conductive and a current circulates through the NPN transistor Q22, mounted as a diode, towards the base of transistor Q24 mounted in parallel with the capacitor C1 rendering this transistor Q24 conductive, which short-circuits the capacitor C1 of the oscillating device 20 and blocks this oscillating device. Thus, the system is stabilized to a condition such that:

$$V._{AUX} = V_{CC} + V_{BE17} + R_8 \times I_{25}$$

in which $I_{25}$ is the current in the transistor Q25 and thus in the resistance $R_8$.

It will be noted that the specific connection of the transistors Q22 an Q23 is intended to ensure a slight hysteresis so as to prevent and erratic operating pattern.

Apart from the explanation of the oscillating device 20 and of the control circuit 24, the diagram of FIG. 5 is furthermore similar to that of FIG. 4. It will however be noted that the transistor T2 instead of being constituted by a single transistor, is replaced by two transistors Q26 and Q27 which are themselves mounted to form a Darlington type circuit with a resistance R13 on the emitter of the transistor Q27, this resistance being equal to the resistance RE2 represented in FIG. 3A.

In practice, other resistances intended to stabilize the operating of the circuit will be provided, especially a leak resistance disposed between the base and the emitter of the transistor T1.

By way of variant of the present invention, and in order to improve the exact control of the auxiliary voltage, i.e. more specifically the base current of the transistor T1, it is possible to foresee as an addition to the circuit described herein-above in relation to FIG. 5 means utilizing a current detection device in transistor T1.

This variant is represented in FIG. 6. The transistor T1 is modified. In this transistor, of the NPN type, a supplementary P diffusion is performed at the same time as the base diffusion and in the vicinity thereof. A supplementary NPN transistor is thus formed of which the emitter corresponds to the base of the transistor T1, the base corresponds to the collector of the transistor T1 and the emitter is the supplementary P diffusion. When the transistor T1 approaches a saturation state, the potential of its base becomes higher than that of its collector. Accordingly, the base-emitter junction of the supplementary PNP transistor is biased in the direct sense; there thus occurs a carrier emission of which part may be collected through the supplementary diffusion P. This supplementary transistor thus allows to supply a signal indicating that the transistor T1 has reached saturation.

This indicative signal will be used in relation to the comparator Q20–Q21 described herein-above in order to better control the auxiliary voltage $V._{AUX}$. With this aim, to the series connection comprising the diode Q17, the resistance R8, the transistor Q25 and the resistance R9, are added between the connection of the resistance R8 to the base of the transistor Q20 and the collector of the transistor Q25 a diode Q29. The connecting point between this diode Q29 and the collector of the transistor Q25 is connected to the collector of the PNP auxiliary transistor. The current collected by the collector of the auxiliary transistor will flow into the current supply constituted by the transistor Q25. Therefore, the current herein-above designated $I_{25}$ flowing into the resistance R8 will be reduced since the total current in the transistor Q25 remains constant, i.e. the first term of comparison set out herein-above for the comparator Q20–Q21 which is $V_{BE17} + R_8 \times I_{25}$ will be reduced once the transistor T1 enters into saturation. By controlling in a suitable manner the dimension and the form of the P type diffusion constituted in the collector of the supplementary transistor with respect to the value of the current imposed by the transistor Q25 and with respect to the value of R8, it is possible to obtain an adapted auxiliary voltage, according to whether the transistor T1 is in saturation state or not, so that the transistor T1 is always at the limit of saturation, i.e. at the state where it consumes the least The diode Q29 is intended to prevent the collector of the super-supplementary transistor superposed on transistor T1 from reaching transitorily a higher voltage than the power supply $V_{CC}$ which would induce an opposite conduction of this transistor.

We claim:

1. A device for controlling an output Darlington type circuit of an integrated circuit comprising a first and a second transistor, said first transistor having an emitter, a collector, a base, and first and second main electrodes each connected to a predetermined respective one of said emitter and said collector of said first transistor, said second transistor having an emitter, a collector, a base and first and second main electrodes each connected to a predetermined respective one of said emitter and said collector of said second transistor, the first main electrode of the first transistor being connected to a power terminal and the second main electrode thereof being connected to a ground terminal, a load being connected between one of these main electrodes and the corresponding terminal, the base of said first transistor being connected to a second main electrode of the second transistor, the base of which receives a control current, wherein the first main electrode of the second transistor is connected to an auxiliary voltage $(V._{AUX})$ so that $(V._{AUX})$ is substantially equal to $$V + V_{BE1} + V_{CE2}$$

where:

$V_{BE1}$ is the base-emitter voltage of the first transistor;

$V_{CE2}$ is the collector-emitter voltage of the second transistor at saturation; and V is the ground potential if the load is connected to the power terminal and is equal to $V_{CC} - V_{CE1}$ if the load is connected to ground, $V_{CE1}$ being the collector-emitter voltage at saturation of the first transistor and $V_{CC}$ being the voltage at the power terminal, and wherein said auxiliary voltage $(V._{AUX})$ is obtained from the power terminal through a regulated DC-DC converter integrated in the integrated circuit comprising the Darlington type circuit.

2. Device according to claim 1, wherein the converter is an inductance converter with accumulation capacity and discontinuous conduction of a flyback type comprising an inductance of which a load duration and then a discharge duration into a capacitor is controlled by an oscillating device.

3. Device according to claim 2 in which a period of the oscillating device comprises a first state and a second state, wherein a duration of the first state depends upon the value of the power supply voltage $V_{CC}$.

4. Device according to claim 3, wherein the duration of the first state is ensured by a charge duration, by a voltage associated to the value $V_{CC}$, of a low value integrated capacitor.

5. Device according to claim 3, wherein the control is ensured by a saturation detection of a main transistor of the Darlington type circuit.

6. Device according to claim 2, wherein it further comprises a control circuit for interrupting the operating of the oscillating device when the auxiliary voltage shifts from a selected value.

* * * * *